United States Patent
Grottenmüller et al.

(10) Patent No.: US 10,000,665 B2
(45) Date of Patent: Jun. 19, 2018

(54) HYBRID MATERIAL FOR OPTOELECTRONIC APPLICATIONS

(71) Applicant: AZ ELECTRONIC MATERIALS (LUXEMBOURG) S.A.R.L., Luxembourg (LU)

(72) Inventors: Ralf Grottenmüller, Wiesbaden (DE); Rosalin Karunanandan, Frankfurt am Main (DE); Fumio Kita, Wiesbaden (DE); Helmut Lenz, Eschborn (DE); Dieter Wagner, Wiesbaden (DE); Andreas Dresel, Hünstetten (DE)

(73) Assignee: AZ Electronic Materials (Luxembourg) S.a.r.l., Luxembourg (LU)

( * ) Notice: Subject to any disclaimer, the term of this patent is extended or adjusted under 35 U.S.C. 154(b) by 109 days.

(21) Appl. No.: 15/120,936

(22) PCT Filed: Feb. 27, 2015

(86) PCT No.: PCT/EP2015/054129
§ 371 (c)(1),
(2) Date: Aug. 26, 2016

(87) PCT Pub. No.: WO2015/128460
PCT Pub. Date: Sep. 3, 2015

(65) Prior Publication Data
US 2016/0362580 A1    Dec. 15, 2016

(30) Foreign Application Priority Data

Feb. 28, 2014  (EP) .................................. 14157206
Jul. 29, 2014  (EP) .................................. 14178925

(51) Int. Cl.
*C09D 183/16* (2006.01)
*C08K 3/22* (2006.01)
(Continued)

(52) U.S. Cl.
CPC .......... *C09D 183/16* (2013.01); *C08G 77/62* (2013.01); *C08J 3/247* (2013.01); *C08K 3/0033* (2013.01);
(Continued)

(58) Field of Classification Search
None
See application file for complete search history.

(56) References Cited

U.S. PATENT DOCUMENTS 6,912,092 B2    6/2005  Ukuda
2006/0255716 A1    11/2006  Tsutsumi et al.
(Continued)

FOREIGN PATENT DOCUMENTS

CN    103222076 A    7/2013
CN    103328575 A    9/2013
(Continued)

OTHER PUBLICATIONS

M. Yoshida et al., "TiO2 nano-particle-dispersed polyimide composite optical waveguide materials through reverse micelles", Journal of Material Science 1997 vol. 32, pp. 4047-4051.
(Continued)

*Primary Examiner* — Nathan T Leong
(74) *Attorney, Agent, or Firm* — Drinker Biddle & Reath LLP

(57) ABSTRACT

A hybrid material for light emitting diodes, comprising
a) an organopolysilazane material, comprising repeating units of formulae (I) and (II)

Figure 1:
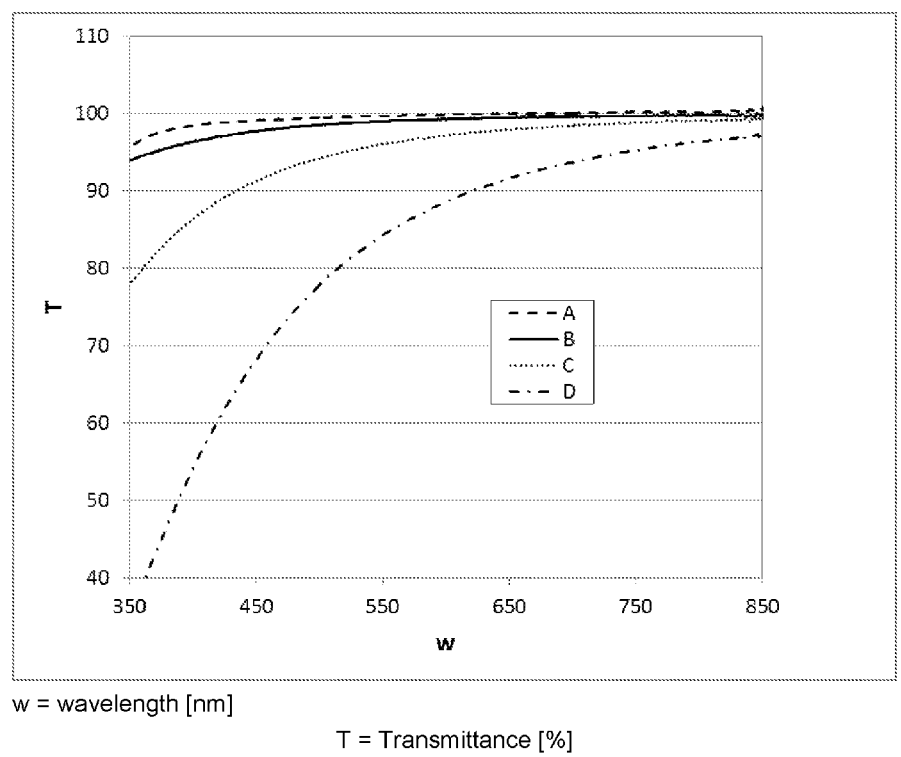

$$[-SiR^1R^2-NR^3-]_x \quad (I)$$
$$[-SiHR^4-NR^5-]_y \quad (II)$$

wherein the symbols and indices have the following meanings:
$R^1$ is $C_2$-$C_6$-alkenyl or $C_4$-$C_6$-alkadienyl;
$R^2$ is H or an organic group;
$R^3$ is H or an organic group;
$R^4$ is H or an organic group;
(Continued)

$R^5$ is H or an organic group;
x is 0.001 to 0.2; and
y is 2x to (1−x),
with the proviso that x+y≤1 and that y can be 0 if $R^2$ is H, and
b) inorganic nanoparticles having a mean diameter in the range of from 1 to 30 nm,
which are surface modified with a capping agent comprising a $C_1$-$C_{18}$-alkyl and/or $C_1$-$C_{18}$-alkenyl group,
is useful as encapsulation material for LEDs.

21 Claims, 6 Drawing Sheets

(51) Int. Cl.

| | |
|---|---|
| C08K 9/06 | (2006.01) |
| H01L 33/52 | (2010.01) |
| C08K 3/00 | (2018.01) |
| C08K 3/36 | (2006.01) |
| C08G 77/62 | (2006.01) |
| C08J 3/24 | (2006.01) |
| C09D 7/12 | (2006.01) |
| H01L 33/56 | (2010.01) |
| C08K 9/04 | (2006.01) |

(52) U.S. Cl.
CPC .................. *C08K 3/22* (2013.01); *C08K 3/36* (2013.01); *C08K 9/06* (2013.01); *C09D 7/1225* (2013.01); *C09D 7/1266* (2013.01); *H01L 33/52* (2013.01); *H01L 33/56* (2013.01); *C08G 2190/00* (2013.01); *C08J 2383/16* (2013.01); *C08K 9/04* (2013.01); *C08K 2003/2241* (2013.01); *C08K 2003/2244* (2013.01); *C08K 2201/003* (2013.01); *C08K 2201/011* (2013.01); *H01L 2933/005* (2013.01)

(56) References Cited

U.S. PATENT DOCUMENTS

| | | | |
|---|---|---|---|
| 2008/0085373 A1* | 4/2008 | Karshtedt | C08G 77/60 427/487 |
| 2011/0240931 A1* | 10/2011 | Jang | B82Y 30/00 252/512 |
| 2012/0018761 A1 | 1/2012 | Honda | |
| 2012/0256223 A1 | 10/2012 | Washizu | |
| 2013/0209682 A1* | 8/2013 | Massingill, Jr. | C04B 41/009 427/240 |
| 2013/0221393 A1* | 8/2013 | Mao | H01L 33/44 257/98 |
| 2013/0273320 A1 | 10/2013 | Brockmeyer et al. | |
| 2014/0008697 A1 | 1/2014 | Harkness et al. | |

FOREIGN PATENT DOCUMENTS

| | | |
|---|---|---|
| EP | 2592056 A1 | 5/2013 |
| JP | 2009-146924 A | 7/2009 |
| JP | 2012-167191 A | 9/2012 |
| JP | 2013-19041 A | 1/2013 |
| KR | 10-1238738 B1 | 3/2013 |
| WO | 2012-067766 | 5/2012 |

OTHER PUBLICATIONS

International Search Report for PCT/EP2015/054129 corresponds to U.S. Appl. No. 15/120,936.
JP2012-167191A—Machine Language English Translation.
JP2009-146924A—Machine Language English Abstract and Translation from JPO.
JP2013-19041A—Machine Language English Abstract and Translation from JPO.
KR10-1238738 B1—Machine Language English Abstract and Translation from KIPRIS.
Chinese Office Action dated Nov. 1, 2017 for Chinese Application No. 201580023678.4 and English translation.

* cited by examiner w = wavelength [nm]

T = Transmittance [%]

d = particle diameter [nm]
f = frequency - volume [%]

d = particle diameter [nm]
f = frequency - volume [%]

RI = refractive index
w = weight% of ZrO$_2$ in Hybrid material w = wavelength [nm]
T = Transmittance [%]

w = wavelength [nm]
T = Transmittance [%]

HYBRID MATERIAL FOR OPTOELECTRONIC APPLICATIONS

This application is a United States National Stage Patent Application under 35 U.S.C. § 371 of International Patent Application No. PCT/EP2015/054129, filed Feb. 27, 2015, which claims priority to European Patent Application No. 14157206.5, filed Feb. 28, 2014, and European Patent Application No. 14178925.5, filed Jul. 29, 2014, the contents of each being hereby incorporated herein by reference in its entirety.

The invention relates to the field of light emitting diode (LED) technology. Especially the invention relates to a hybrid material useful as an LED encapsulation material. The invention further relates to the field of organopolysilazanes that can be used as an encapsulating material for LEDs.

There is a high demand in the electronic industry to find suitable encapsulating polymer materials for LEDs. Such materials face—inter alia—the challenge that the polymer needs to have, in addition to optical clarity and high temperature service, the advantageous property of a high refractive index.

Until now, no polymers have been reported with a high refractive index (over 1.52) and high transparency accompanied by resistance to yellowing induced by thermal degrdn. above 150° C. aging in air. Phenyl hybrids have a refractive index about 1.56 with bad thermal stability against discoloration to yellow by aging even at 160° C., which is a key factor for the long lifetime of a LED encapsulant.

According to the thesis "Synthesis and characterization of high-breaking hybrid materials for optical applications" by David Düsselberg commercial optical polymers like polymethylmethacrylate (PMMA), polycarbonate (PC) or polysulfon (PSU) have a refractive index in the area of 1.49 to 1.63 and lack thermal stability. A thermal stability for up to 200° C. is necessary for LED applications.

The refractive index is influenced by the chemical structure of the polymers. The density of the material plays a major role. The higher the density of a material the higher is the refractive index. Aromatic structures like e.g. phenyls or heteroatoms like sulfur are able to increase the refractive index in the polymer. Such polymers as e.g. polyetheretherketones have a refractive index of 1.71 but are not transparent—but in this case grey—as necessary for optical applications as LED application. Polyimides are highly chemically and mechanically stable. Sulfur containing polyimides can reach more than nD>1.7 but are yellow which is of poor use for LED applications.

Conventional polymers are not able to reach refractive indexes of above 1.8. To increase the refractive index further, one needs to combine the properties of organic polymers with inorganic materials. Inorganic materials as titaniumdioxide and zirconiumdioxide have a refractive index in the area of 2.2-2.7. Such materials containing an organic and inorganic component are called hybrid materials. It is known that such inorganic nanoparticles of e.g. $TiO_2$-rutil ($n_D$=2.7) can be used as fillers in polymers to increase their refractive index (Yoshida et al., Journal of Material Science, 1997, 32, 4047-4051 and U.S. Pat. No. 6,912,092 B2, 2005 by Ukuda).

Depending on the loading the refractive index could be increased. The challenge is to avoid agglomeration during dispersion of the nanoparticles. The higher the amount of nanoparticles in the hybrid material the higher is the risk of agglomeration. Agglomeration is a problem because if the hybrid material is not homogeneous its appearance will turn opaque. Opaque materials are of poor use for optical applications as LED purposes.

EP 2 592 056 A1 discloses that coatings for glass or glass ceramics can include an organic, inorganic, polysiloxane and/or silazane based matrix.

LED displays are mentioned as potential applications.

JP 2013 019041 (A) discloses a zinc oxide film containing polysilazane.

JP 2012 167191 (A) discloses an inorganic composition including a rare earth metal or/and a transition metal in the fourth period dispersed in an inorganic matrix having long-term light resistance and heat resistance with high concentration and uniformity, and a process for producing them at a low temperature and with easy moldability.

US 2011/0240931 (A) describes a nanoparticle-resin composition comprising a nanoparticle, a silicone resin, a silane compound and a silazane compound. Specific silazane compounds are mentioned as well as nanoparticles and the application for LEDs.

US 2012/0256223 A1 discloses a coating for LED application consisting of polysilazane, fine particles and phosphors. The coating requires heating up to 700° C. which turns the polysilazane to a ceramics.

US 2012/0018761 A1 describes phosphor members for an LED light including phosphor particles and an inorganic layer which comprises a polysiloxane bond. The polysiloxane composition precursor comprises a polysilazane. The coating requires heating at 700° C.

JP 2009 146924 (A) discloses an LED element sealed by a resin-sealing layer comprising a zirconia dispersion resin layer. The zirconia layer contains zirconia fine particles surface treated by either silane, siloxane, silazane or fatty acids. The main constituent is either an epoxy-based or an acryl-based resin.

US 2006/0255716 A1 describes an LED comprising a transparent binder and particles. The transparent binder is a ceramic derived from metal alkoxides or polysilazane. No details are given about the chemistry of the polysilazane.

KR-B 10-1238738 discloses organopolysilazanes as encapsulation material for LEDs. Inorganic nanoparticles are not disclosed in this document.

WO 2012/067766 discloses LEDs comprising a bonding layer containing an organopolysilazane. The bonding layer may further comprise inorganic nanoparticles.

LEDs can generate both high thermal flux and high optical flux. The LED package as well as the encapsulation material need to perform stably when exposed to heat and/or radiation (ultra-violet and/or visible radiation). The right encapsulation material plays a major role in improving LED performance. So far many encapsulation materials suffer from among other loss of transmittance during the lifetime of usage of the LED.

It has now been found that specific organopolysilazanes in combination with specific surface modified inorganic nanoparticles are useful as high refractive index encapsulation materials for light emitting diodes. Surprisingly, such materials show a lower CTE (coefficient of thermal expansion) compared to non-modified polysilazane materials and the refractive index does not change if the hybrid material is exposed to higher temperature and humidity conditions which can cause hydrolysis of polysilazane to polysiloxane.

Accordingly, in one aspect of the invention there is provided a hybrid material comprising
a) an organopolysilazane material, comprising repeating units of formulae (I) and (II),

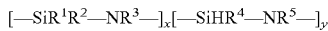
[—SiR$^1$R$^2$—NR$^3$—]$_x$[—SiHR$^4$—NR$^5$—]$_y$ wherein the symbols and indices have the following meanings:
R$^1$ is C$_2$-C$_6$-alkenyl or C$_4$-C$_6$-alkadienyl, preferably vinyl or allyl, more preferably vinyl;
R$^2$ is H or an organic group;
R$^3$ is H or an organic group, preferably H;
R$^4$ is H or an organic group, preferably an organic group;
R$^5$ is H or an organic group, preferably H;
x is 0.001 to 0.2; and
y is 2·x to (1−x),
with the proviso that x+y≤1 and that y can be 0 if R$^2$ is H, where x and y denote the molar ratio of these repeating units with respect to the total of all repeating units Si—N in the organopolysilazane material, and
b) inorganic nanoparticles having a mean diameter in the range of from 1 to 30 nm, which are surface modified with a capping agent comprising a C$_1$-C$_{18}$-alkyl and/or C$_1$-C$_{18}$-alkenyl group.

In a further aspect of the invention there is provided a process for preparing a hybrid material of the invention, wherein a solution of organoypolysilazane with a dispersion of nanoparticles is mixed and the solvent is removed.

In a further aspect of the invention there is provided a process for producing an LED, comprising the steps of
Ia) applying a hybrid material of the invention to the LED as an encapsulating layer and
Ib) curing the encapsulation material of the invention for 1 min to 6 h at a temperature of from 80° C. to 220° C. in an inert atmosphere or air.

In a further aspect of the invention there is provided an encapsulating material for LEDs, obtainable by providing an hybrid material of the invention and curing the material for 1 min to 6 h at a temperature of from 80° C. to 220° C. in an inert atmosphere or air.

In yet a further aspect of the invention there is provided an LED, comprising the hybrid material of the invention.

In yet a further embodiment of the invention there is provided the use of the hybrid material of the invention as an encapsulation material for LEDs.

"Hybrid material" as used herein means a material consisting of two constituents, an organic and inorganic material, the inorganic material being at the nanometer level. The hybrid material may contain additives in addition to the two constituents.

The hybrid material can act within other functions as a functional layer, e. g. optical layer or binding layer for e. g. smartphones or displays. Preferred is the use of the hybrid material as an encapsulating material as described below.

"Encapsulation material" or "encapsulant" as used herein means a material that covers the light emitting material (LED chip) and forms a barrier between the light emitting material of the LED device and the external environment of the LED device. The encapsulating material is preferably in direct contact with the light emitting material of the LED. The encapsulation material can be part of a package comprising the light emitting material and/or lead frame and/or gold wire, and/or solder (flip chip) the filling material, converter and a primary and secondary optic. The encapsulation material can cover the light emitting material and/or lead frame and gold wire and may contain a converter. The encapsulation material has the function of a surface protection material against external environmental influences and guarantees long term reliability that means aging stability. In general the layer of the encapsulation material has a thickness of from 100 μm to 1 cm, preferably of from 200 μm to 5 mm.

The external environmental influence can be chemical or mechanical like moisture or chemicals (e.g. acids, bases, oxygen within others). The external environmental influence can also be temperature. The encapsulant shows temperature resistance between −55 to +260° C. The encapsulation material of the invention can act as a binder for the converter, such as phosphor powders. The encapsulant can be shaped in order to provide primary optic functions (lens). The encapsulant can also act as a glue material e.g. to attach lenses to the LED package. The encapsulant shows good adhesion to substrates (inter alia Si, sapphire and SiC).

"LED" as used herein means an LED device comprising a light emitting material, i.e. a light emitting diode, as well as the other components like LED chip, and/or lead frame, the filling materials, converters, primary and secondary optics, and/or wiring and/or solder.

"Refractive index" as used herein, is defined as n=c/v, where c is the speed of light in vacuum and v is the speed of light in the material for which n is determined. It describes how light propagates in the material. n is determined at 594 nm and 20° C.

"Transparent" as used herein means a transmittance of ≥80% at a thickness of 3 mm and a wavelength of 450 nm. "Opaque" as used herein means a transmittance of <80% at a thickness of 3 mm and a wavelength of 450 nm.

"Nanoparticle" as used herein, means particles with a size in the range of 1 to 100 nm.

The organopolysilazane material a) according to the invention comprises repeating units of formula (I) and (II)

$$[\text{—SiR}^1\text{R}^2\text{—NR}^3\text{—}]_x \quad \quad (I)$$

$$[\text{—SiHR}^4\text{—NR}^5\text{—}]_y \quad \quad (II)$$

as described above.

"Organopolysilazane" as used herein is intended to include any oligomeric or polymeric composition. In addition, the term "organopolysilazane" denotes a compound which includes four or more Si—N units in which the nitrogen atoms are bonded to at least two silicon atoms. "Oligomer" is also intended to mean a molecule or chemical compound comprising several repeat units, generally from about 4 to 10 repeat units. "Polymer", as used herein, means a molecule or compound which comprises a large number of repeat units, i.e. greater than 10 repeat units.

The oligomeric or polymeric organosilazanes of this invention may be amorphous or crystalline in nature. Such compositions may be liquid or solids which are cyclic, linear or cyclo-linear in nature.

The structure shown in formulae (I) and (II) is only a simplified representation showing the monomers used for synthesis. In reality the structure of the oligomers and polymers is not only linear, but predominantly consists of separate or condensed rings and three-dimensional arrangements. Organosilazanes, therefore, contain tertiary (referring to silicon) nitrogen "Si$_3$N" and possibly primary nitrogen "SiNR$_2$" beside secondary nitrogen "SiNR". Likewise they contain tertiary (referring to nitrogen) Si-groups "N$_3$SiR", possibly primary Si-groups "NSiR$_3$" beside secondary Si-groups "N₂SiR₂". The exact structure may vary, e.g. based on the specific synthesis and the nature of the groups R.

Preferably the symbols and indices in formulae (I) and (II) have the following meanings:
$R^1$ is preferably $(C_2-C_6)$-alkenyl or $(C_4-C_6)$-alkadienyl.
$R^2$ is preferably $(C_1-C_8)$-alkyl, $(C_2-C_6)$-alkenyl, $(C_3-C_6)$-cycloalkyl, $(C_6-C_{10})$-aryl or H.
$R^3$ is preferably H or $(C_1-C_8)$-alkyl, $(C_2-C_6)$-alkenyl, $(C_3-C_6)$-cycloalkyl or $(C_6-C_{10})$-aryl.
$R^4$ is preferably H or $(C_1-C_8)$-alkyl, $(C_2-C_6)$-alkenyl, $(C_3-C_6)$-cycloalkyl or $(C_6-C_{10})$-aryl.
$R^5$ is preferably H or $(C_1-C_8)$-alkyl, $(C_2-C_6)$-alkenyl, $(C_3-C_6)$-cycloalkyl or $(C_6-C_{10})$-aryl.
x is preferably 0.02 to 0.1.
y is preferably 2*x to 0.98.

Preferred are organopolysilazanes comprising repeating units (I) and (II) where all the symbols and indices in formulae (I) and (II) have the preferred meanings.

More preferably the symbols and indices in formulae (I) and (II) have the following meanings:
$R^1$ is more preferably vinyl or allyl.
$R^2$ is more preferably $(C_1-C_4)$-alkyl, phenyl or H.
$R^3$ is more preferably H.
$R^4$ is more preferably $(C_1-C_4)$-alkyl, phenyl or H.
$R^5$ is more preferably H.
x is more preferably 0.03 to 0.075.
y is more preferably 2*x to 0.97.

More preferred are organopolysilazanes comprising repeating units (I) and (II) where all the symbols and indices in formulae (I) and (II) have the more preferred meanings.

Particularly preferably the symbols and indices in formulae (I) and (II) have the following meanings:
$R^1$ is particularly preferably vinyl.
$R^2$ is particularly preferably methyl, ethyl, propyl or phenyl.
$R^3$ is particularly preferably H.
$R^4$ is particularly preferably methyl, ethyl, propyl or phenyl.
$R^5$ is particularly preferably H.
x is particularly preferably 0.03 to 0.06.
y is particularly preferably 2*x to 0.97.

Particularly preferred are organopolysilazanes comprising repeating units (I) and (II) where all symbols and indices in formulae (I) and (II) have the particularly preferred meanings.

"Alkyl" as used herein means a linear or branched, preferably linear alkyl group, which is unsubstituted or substituted, preferably unsubstituted. Examples are methyl, ethyl and n-propyl and isopropyl.

"Alkenyl" as used herein means a linear or branched, preferably linear alkenyl group, which is unsubstituted or substituted, preferably unsubstituted. Examples are vinyl or allyl.

"Alkadienyl" as used herein means a linear or branched, preferably linear, alkyl group, comprising two carbon-carbon double bonds which are conjugated or non-conjugated, which is unsubstituted or substituted, preferably unsubstituted. Examples are 1.3-butadienyl and 1.5-hexadienyl.

"Cycloalkyl" as used herein means an unsubstituted or substituted, preferably unsubstituted cycloalkyl group, e.g. cyclopropyl or cyclohexyl.

"Aryl" as used herein means an aryl group which is unsubstituted or substituted, preferably unsubstituted, and is preferably phenyl.

If an alkyl, alkenyl or alkadienyl group is substituted, it is substituted with one or more, preferably one substituent, preferably selected from the group consisting of $SiOR'_3$ (R' being $C_1-C_4$-alkyl), OR" (R" being an aliphatic, cycloaliphatic or aromatic group), and aromatic groups. The organopolysilazane material of the invention consists of one or more organopolysilazanes. In one embodiment the organopolysilazane material comprises an organopolysilazene comprising repeating units of formulae (I) and (II). In another embodiment the organopolysilazane material comprises an organopolysilazane comprising repeating units of formulae (I) and another organopolysilazane comprising repeating units of formula (II).

In a further preferred embodiment of the organopolysilazane material, the repeating units of formulae (I) and (II) are those of formulae (Ia) and (IIa), respectively,

(Ia)

(IIa)

where the symbols and indices have the meanings and preferred meanings given above.

In a further preferred embodiment $R^2$, $R^3$ and $R^4$, $R^5$ independently of one another are a radical from the group consisting of methyl, ethyl, propyl, isopropyl, butyl, isobutyl, tert-butyl, phenyl, vinyl, 3-(triethoxysilyl)propyl, and 3-(trimethoxy-silyl)propyl) or $R^2$, $R^3$ are hydrogen.

Particular preference is given to an organopolysilazane material in which—$R^1$ is vinyl, $R^2$ is methyl, $R^3$ is hydrogen, $R^4$ is methyl and $R^5$ is hydrogen.

In one preferred embodiment the organopolysilazane material comprises an organopolysilazane consisting of repeating units of the formulae (I) and (II).

In a preferred embodiment of this material the repeating units of the formula (I) and (II) are

(I-1)

and

(II-1)

In a preferred embodiment of this material x=0.8 and y=0.2.

Such a material is commercially available under the tradename HTT 1800 from AZ Electronic Materials GmbH, Germany.

In one embodiment of the invention, the organopolysilazane material consists of an organopolysilazane consisting of repeating units of formulae (I) and (II), preferably (I-1) and (II-1), in particular in the ratio of x=0.8 and y=0.2.

In a further embodiment, the organopolysilazane material of the invention comprises one or more organopolysilazane comprising a repeating unit of formula (I) and/or formula (II) and one or more, preferably one or two, more preferably one, repeating units of formula (III) and/or (IV),

(III)

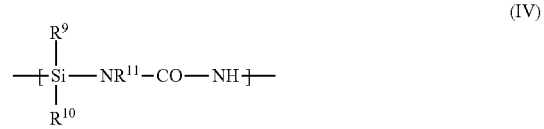

(IV)

wherein

R⁶, R⁷, R⁹, R¹⁰ are independently an organic group;
R¹⁰ is H or an organic group, and
R⁸ and R¹¹ are independently H or an organic group.

Preferably the symbols in formulae (III) and (IV) have the following meanings:

$R^6$, $R^7$ and $R^9$ are preferably independently $(C_1-C_8)$-alkyl, $(C_3-C_6)$-cycloalkyl or $(C_6-C_{10})$-aryl.

$R^{10}$ is preferably independently $(C_1-C_8)$-alkyl, $(C_3-C_6)$-cycloalkyl or $(C_6-C_{10})$-aryl, $(C_2-C_6)$-alkenyl, $(C_4-C_6)$-alkadienyl or H.

$R^8$ and $R^{11}$ are preferably independently H, $(C_1-C_8)$-alkyl, $(C_3-C_6)$-cycloalkyl or $(C_6-C_{10})$-aryl.

Preferred are repeating units (III) and/or (IV) where all the symbols have the preferred meanings.

More preferably the symbols in repeating units (III) and/or (IV) have the following meanings:

$R^6$, $R^7$ and $R^9$ are more preferably independently $(C_1-C_4)$-alkyl or phenyl.

$R^{10}$ is more preferably $(C_1-C_4)$-alkyl, phenyl, vinyl, allyl, or H.

$R^8$ and $R^{11}$ are more preferably H, $(C_1-C_4)$-alkyl or phenyl.

More preferred are repeating units (III) and/or (IV) where all the symbols have the more preferred meanings.

Particularly preferably the symbols in repeating units (III) and/or (IV) have the following meanings:

$R^6$, $R^7$ and $R^9$ are particularly preferably independently methyl, ethyl, propyl or phenyl.

$R^{10}$ is particularly preferably methyl, ethyl, propyl, phenyl, vinyl or H.

$R^8$ and $R^{11}$ are particularly preferably independently H methyl, ethyl, propyl or phenyl.

Particularly preferred are repeating units (III) and/or (IV) where all the symbols have the particularly preferred meanings.

If $R^6$, $R^7$, $R^8$, $R^9$, $R^{10}$, or $R^{11}$ are alkyl, the alkyl group is linear or branched, and is unsubstituted or substituted, preferably with one or more substituents selected from the group consisting of $Si(OR')_3$ (R' being $(C_1-C_4)$-alkyl, preferably methyl or ethyl), OR" (R" being an aliphatic, cycloaliphatic or aromatic group), and aromatic groups Examples of repeating units (III) are:

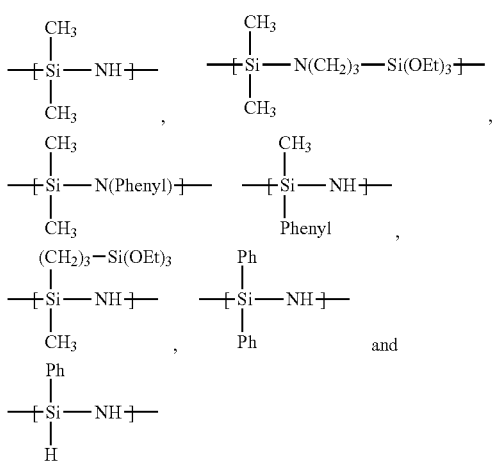

Examples of particularly preferred repeating units (IV) are:

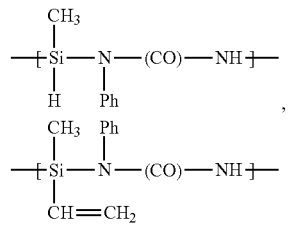

A typical material comprising repeating units (II) and (III) is

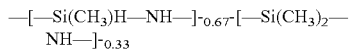

Such a material is available as ML 33 from AZ Electronic Materials Germany GmbH, Wiesbaden, Germany. The organopolysilazanes can be obtained under the respective tradenames from AZ Electronic Materials Germany GmbH, Wiesbaden, Germany.

In one embodiment the organopolysilazane material of the invention comprises an organopolysilazane consisting of a repeating unit of formula (I), a repeating unit of formula (II) and one or more, preferably one or two, more preferably one, repeating units of formula (III) and/or (IV).

In one embodiment the organopolysilazane material consists of one or more, preferably one of the above, organopolysilazanes.

In a further embodiment the organopolysilazane material of the invention comprises one or more, preferably one or two, organopolysilazanes consisting of a repeating unit of formula (I) and/or one or two repeating units of formula (II), and of one or two repeating units of formula (II), and of one or two, preferably one, repeating units of formula (III) and/or (IV), preferably of formula (III).

In one preferred embodiment of the invention the organopolysilazane material is a mixture of ML-33 and HTT-1800 (see above).

The ratio of ML-33 to HTT-1800 is preferable from 90%:10% to 10%:90%, more preferable from 85%:15% to 25%:75%, and particularly preferable 80%:20% to 50%:50% (all percentages by weight).

Further, the synthesis of these materials is well known to those skilled in the art and usually is carried out by reacting dichlorosilanes with ammonia according to the following equation:

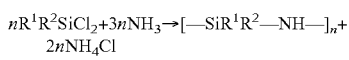

It is described in a multitude of patents, e.g. U.S. Pat. No. 4,395,460, U.S. Pat. No. 2,264,674, U.S. Pat. No. 4,954,596 and U.S. Pat. No. 6,329,487.

In a preferred embodiment of the invention the organopolysilazane material is subjected to a pre-crosslinking treatment before being applied to the LED. In this way, the amount of low molecular weight material is reduced, which leads to a reduced loss of material due to evaporation in the final curing step.

Several methods have been described for such a crosslinking, e.g. in U.S. Pat. No. 6,329,487. Further crosslinking by the reaction with isocyanates (J. Schwank, Mat. Res. Soc. Syn. Proc 271 (1992) 807) or the introduction of boron bridges (EP-A 0 389 084) has been reported.

In a preferred embodiment of the invention an organopolysilazane material of the invention is produced by a process, comprising the step of reacting an organopolysilazane, comprising structural units of the following formula,

wherein R is an organic group bonded through carbon, with a base catalyst in order to form a crosslinked product.

Crosslinking of organopolysilazanes comprising N—H and SiH bonds can be effected by the catalytic action of various basic compounds with a base strength strong enough to activate the N—H group of the organosilazane. Suitable Bases are for example strong tertiary amines, amides of the type $R^1R^2NM$, with $R^1$ and $R^2$ being independently hydrogen or an organic moiety and M being an cationic counterion like alkali or earth alkali or an organometallic base like butyl-lithium or Grignard compounds. The catalytic crosslinking reaction has to be performed in a non-reactive solvent at a suitable temperature to avoid a too vigorous or too slow reaction.

A variety of basic compounds with a base strength strong enough to activate the N—H group of the organosilaznes can be used as catalyst. For example strong tertiary amines $R_3N$ like 1.8-diazabicyclo[5.4.0]undec-7-ene or 1.5-diazabicyclo[4.3.0]non-5-ene are possible. Other types of base catalysts are amides of the general formula RaRbNM with Ra and Rb independently hydrogen or an organic moiety and M a cationic counterion like alkali or earthalkali. Examples are $NaNH_2$, $Ca(NH_2)_2$, $LiN(i-C_3H_7)_2$ and $KN(SiMe_3)_2$. Hydrides like NaH, $CaH_2$, $LiAlH_4$ or KH are possible too. Other types of base catalysts are organometallic base like for example butyl-Lithium or Grignard compounds like alkyl- or aryl-magnesium-brom ides. The catalytic crosslinking reaction has to be performed in a solvent inert under strong alkaline conditions and non-reactive with the organosilazane and especially the Si—H groups. Useful solvents are alkanes, ethers and aromatic compounds. Examples of useful solvents are n-heptane, cyclohexane, THF, 1.4-dioxane, di-propylether, toluene and xylene. The reaction has to be performed at a suitable temperature to avoid a too vigorous or too slow reaction. Typical reaction temperatures are in the range of −20° C. up to +100° C. It is important to select the correct combination of catalyst, solvent and temperature to ensure smooth reaction and an appropriate degree of crosslinking.

$M_w$ is determined by GPC against a polystyrene standard.

Preferred GPC conditions are the following: the eluent is a mixture of THF and 1.45 weight % hexamethyldisilazane, the columns are Shodex KS-804 and 2×KS-802 and KS-801 and the detector is Agilent 1260 Refractive Index Detector. The calibration is done with polystyrene standards.

Viscosity is determined by using the following equipment and conditions:

Brookfield Rheometer R/S plus, Brookfield cone-type spindle RC3-50-1, rotation speed of 3 rpm, Temperature 25° C.

Preferably the amount of low molecular weight material ($M_w$<500 g/mol) in organopolysilazane material is below 15 wt.-%, more preferably <10 wt.-%, particularly preferably <8 wt.-%.

Further, the amount of low molecular weight material with an $M_w$<1000 g/mol is preferably below 40 wt.-%, more preferably <30 wt.-%, particularly preferably <25 wt.-%.

The amount of low molecular weight material can be reduced e.g. by the reaction conditions of the polycondensation reaction, by purification of the organopolysilazanes, and, preferably, by the above described crosslinking reaction.

Component b) of the hybrid material consists of one or more types of inorganic nanoparticles with a mean diameter in the range of from 1 to 30 nm, preferably 3 to 20 nm.

The mean diameter is measured by dynamic light scattering of the dispersed nanoparticles using a MALVERN Zetasizer Nano Z working at a wavelength of 633 nm The refractive index of the inorganic nanoparticles is generally in the range of from 1.50 to 3.00, preferably from 1.75 to 2.75, more preferred 2.00 to 2.20.

The nanoparticles may be selected from semiconductor nanoparticles, a metal nanoparticles, a metal oxide nanoparticles, or a combination comprising at least one of the foregoing.

The semiconductor nanoparticles may be selected from a group II-VI compound, a group III-V compound, a group IV-VI compound, a group IV compound, or a combination comprising at least one of the foregoing. Other suitable inorganic nanoparticles may include ceramics or wide bandgap semiconductors such as $Si_3N_4$, diamond, ZnS and SiC.

The metal nanoparticles may be selected from palladium (Pd), platinum (Pt), nickel (Ni), cobalt (Co), rhodium (Rh), iridium (Ir), iron (Fe), ruthenium (Ru), gold (Au), silver (Ag), copper (Cu), or a combination comprising at least one of the foregoing.

Preferably the inorganic nanoparticles are selected from the group of metal oxide nanoparticles which include oxides of a metal selected from silicon (Si), titanium (Ti), cobalt (Co), tin (Sn), aluminium (Al), zinc (Zn), indium (In), zirconium (Zr), nickel (Ni), hafnium (Hf), vanadium (V), or a combination comprising at least one of the foregoing. More preferred nanoparticles are $ZrO_2$ (n=2.2), $TiO_2$ (n=2.5 Rutil or 3.1 Anatas), $SnO_2$ (n=2.0), $CeO_2$ (n=2.3), $BaTiO_3$ (n=2.4) and $Al_2O_3$, (n=1.77), and most preferred $ZrO_2$, $TiO_2$ and $BaTiO_3$.

Suitable inorganic particles are substantially nonabsorbing over the spectral bandwidth of the emission LED and the emission of the wavelength converter layer. The size and density of the particles can be selected to achieve desired levels of transmission and scattering.

The inorganic nanoparticles are surface treated to promote their uniform dispersion in the bonding material. To ensure the compatibility of the nanoparticles with various dispersing solvents and with the polymer matrix and to prevent nanoparticle aggregation, it is necessary to protect the surface of the nanoparticles. Another purpose of the surface protection is to provide additional functionalities to the nanoparticles like for example double bonds to impart reactivity with acrylic resins or amine groups to impart reactivity with epoxy resins.

Typical agents to protect the nanoparticle surface (sometimes such agents are called "surface ligands", "capping agents" or "coating agents") are organosilanes, organic amines, organic thiols, organic alcohols, trialkyl phosphines, organic carboxylic acids, organic phosphonic acids, inorganic phosphonic acids, zirconates, titanates or any other surfactants-like molecule able to absorb on or react with the surface. Organosilanes are a common class of organic compounds used to protect the surface of oxide nanoparticles. These organosilanes are typically composed of a reactive and a non reactive part. The reactive part of the organosilane is typically either a trialkoxysilane group, a monoalkoxysilane group or a trichlorosilane group, although bi substituted alkoxy and bi and mono substituted chlorosilanes are possible too. The reactive group anchors to the oxide through a covalent bond with the hydroxide group or the —OR group where in R is an alkyl or aryl group present at the surface eliminating alcohol, alkyl chloride, water or HCl as a byproduct. The non reactive part of the organosilane can include one or more of an alkyl chain of various chain length, one or more of a cyclic alkyl group of various chain length, fluorinated alkyl groups, alkenyl groups, epoxy groups, aryl groups, ether groups, amines, thioles or carboxylic acids. The organosilanes have the general structure $R_a Si(OR')_b$ with a=1, 2 or 3, b=4−a, R and R' are organic residues with R' being preferably methyl, ethyl, n- or iso-propyl and n- or iso-butyl. In a preferred embodiment the surface treatment agent is trialkoxy silane compound or a trichlorosilane, where in each case a $C_1$-$C_{18}$-alkyl or $C_2$-$C_{18}$-alkenyl group is bound to the silicon atom. Preferred are $C_1$-$C_6$-alkyl groups or $C_2$-$C_6$-alkenyl groups, more preferred are $C_1$-$C_3$-alkyl or $C_2$-$C_3$-alkenyl, in particular vinyl and allyl.

Examples of organosilane surface treatment agents include methyltrimethoxysilane, methyltriethoxysilane, trimethylmethoxysilane, trimethyl-ethoxysilane, n-propyltrimethoxysilane, n-propyltriethoxysilane, isobutyltrimethoxy-silane, n-hexyltrimethoxysilane, n-octyltrimethoxysilane, n-octyltriethoxysilane, 1.2-bis(trimethoxysilyl)decane, phenyltrimethoxysilane, 4-phenylbutyltrimethoxysilane, acetoxymethyltrimethoxysilane, acetoxyethyltriethoxysilane, hydroxylmethyl-triethoxysilane, hydroxy(polyethylenoxy)propyltriethoxysilane, 2-[methoxy(polyethylenoxy)propyltrimethoxysilane, methoxy(triethylenoxy)propyltrimethoxysilane, 3-aminopropyltrimethoxysilane, p-aminophenyltrimethoxysilane, 3-mercaptopropyltrimethoxysilane, 3-(methacryloyloxy)propyltrimethoxysilane, vinyltrimethoxysilane, vinyltriethoxysilane, allyltrimethoxysilane, 3-isocyanatopropyltrimethoxysilane, 3-isocyanatopropyltriethoxysilane, glycidiloxypropyltrimethoxy-silane, 2-(3.4-epoxycyclohexyl)ethyltrimethoxysilane, 3.3.3-trifluoropropyltrimethoxysilane, nonafluorohexyltrimethoxysilane, methyltrimethoxysilane, propylyltrimethoxysilane, vinyltrimethoxysilane and trimethylmethoxysilane are particularly preferred.

Preferred capping agents for surface treatment are alkoxysilanes of formula (V)

$$R''_n Si(OR''')_m \qquad (V)$$

wherein
n is 1, 2 or 3 and m is 4−n;
R" is methyl, ethyl, linear, branched or cyclic alkyl with 3-8 carbon atoms, phenyl, ($C_2$-$C_6$)-alkenyl; and
R'" is methyl, ethyl, n- or iso-propyl, n- or isobutyl.

Preferred are alkoxysilanes of formula (V), wherein
n is 1 or 3 and m is 4−n;
R" is methyl, ethyl, linear or branched ($C_3$-$C_8$)-alkyl, phenyl or vinyl; and
R'" is methyl or ethyl.

More preferred are alkoxysilanes of formula (V), wherein
n is 1 or 3 and m is 4−n;
R" is methyl, ethyl or linear or branched ($C_3$-$C_8$)-alkyl, and
R'" is methyl or ethyl.

The groups R" and R'", respectively and independently are the same or different. Preferably all groups R" in one compound, and, independently thereof, all groups R" in one compound are the same.

Preferred are hybrid materials of the invention where the capping agent is a alkoxysilane of formula (V), preferred or more preferred embodiment thereof or a mixture thereof.

Other classes of organic compounds used as capping agents to passivate a oxide nanomaterial are carboxylic acids and alcohols. The head of an carboxyl acid is —COOH and the head of an alcohol is —OH. The head anchors to the surface of the oxide through a covalent bond with the hydroxy group (—OH) or the —OR (R=alkyl or aryl) group present at the surface eliminating an alcohol or water as byproduct. The tail of the carboxylic acid or the alcohol can be composed of alkyl chains of a variety of lengths, aryl groups, ether groups, amines, thioles, double bonds or other functional groups.

Examples of carboxylic acids include octanoic acid, acetic acid, propionic acid, 2-[2-(2-methoxyethoxy)ethoxy]acetic acid, benzoic acid, oleic acid and stearic acid.

Examples of alcohols include ethanol, propanol, butanol, hexanol, heptanol, octanol, benzyl alcohol, phenol, dodecylalcohol, oleylalcohol, octadecanol and trithyleneglycol monomethylether.

The inorganic nanoparticles of the invention are preferably monodisperse. In a preferred embodiment the amount of particles with a diameter of >20 nm is ≤10.0% by weight, the amount of particles with a diameter of >30 nm is ≤1.0% by weight, and the amount of particles with a diameter >50 nm is ≤0.1% by weight.

The distribution is determined by dynamic light scattering of the dispersed nanoparticles using a MALVERN Zetasizer Nano Z working at a wavelength of 633 nm.

The hybrid material of the invention can be produced in accordance with the methods disclosed in US 2012/0088845.

In one embodiment the organopolysilazane material is dissolved in a suitable solvent, generally a dipolar aprotic solvent such as e.g. THF and mixed with a dispersion of the inorganic nanoparticles in a suitable solvent, such as an alkylated aromatic hydrocarbon, e.g. toluene. The solvent is then removed, generally by distillation, and the crude product optionally dried in vacuo.

The amount of inorganic nanoparticles in the hybrid material is generally in the range of from 1 to 90%, preferably 10 to 90%, more preferred 10 to 80% by weight.

A further constituent of the hybrid material may be additives, which, for example, influence formulation viscosity, substrate wetting, film formation, or evaporation behavior. In a further embodiment the hybrid material contains up to 10% by weight of further inorganic fillers.

The hybrid material can include up to 60% by weight converters, adhesion promotors and/or softening agents.

In order to produce a mixture of the hybrid material with additives, generally the components are dissolved or dispersed in a solvent or solvent mixture. The solvent is then removed e.g. by distillation. Suitable solvents are e.g. nonpolar or polar non-protic solvents like ethers, cyclic ethers, esters e.g. THF or PGMEA, or aromatic solvents like toluene or alkanes and cycloalkanes like heptane or cyclohexane.

The invention further provides a process in which an LED is encapsulated with a hybrid material of the invention, comprising the steps of dispensing and curing of the hybrid material.

In a first step the hybrid material of the invention, which has preferably been pre-crosslinked as described above, is applied to an LED or its precursor materials, e.g. with an industrial available dispensing system.

In a preferred embodiment, the hybrid material of the invention is applied to the LED as such, i.e. without further dilution. Suitable organopolysilazanes for that kind of application are e.g. characterized by a viscosity range of 100 to 100,000 mPas at a temperature of 25° C. Viscosity is determined by using the following equipment and conditions: Brookfield Rheometer R/S plus, Brookfield cone-type spindle RC3-50-1, rotation speed of 3 rpm., Temperature 25° C. To adjust the viscosity, the temperature during the dispensing process can be varied, generally between 10° C. and 60° C.

In a further aspect of the invention the hybrid material is applied in a solution to form thin coatings.

In this embodiment, the hybrid material, which has preferably been pre-crosslinked as described above, is applied to the LED or its precursor materials in diluted form. Suitable solvents are: solvents that are non-reactive with the organosilazane, especially the Si—H group, and the inorganic nanoparticles at least at short term contact under ambient conditions. Useful solvents are for example (cyclo) alkanes, ethers, esters and aromatic compounds. Examples of useful solvents are n-heptane, cyclohexane, THF, 1.4-dioxane, di-(iso)propylether, ethyl acetate, butyl acetate, toluene and xylene.

After dispensing the hybrid material to the unfinished LED, the material is subjected to a curing process. During this process the liquid and/or oil type material is transformed into a solid material. The mechanical properties of the solid material can be controlled from soft rubber-like to hard glass-like, depending on the chemistry of the organopolysilazane. The curing process is triggered by radiation or heat or crosslinking catalysts, or a combination of heat and crosslinking catalyst or radiation and a crosslinking catalyst. In case of thermal curing, the material is cured for 1 min to 6 hours, preferably 30 min to 5 h, more preferred 3 to 4 h, in particular about 4 h, at a temperature of from 80 to 220° C., preferably 110 to 170° C., more preferred of from 120 to 160° C., in an inert atmosphere or air, preferably an inert, more preferably nitrogen atmosphere.

In a preferred embodiment of the process of the invention, a heating step is carried out before the actual curing, by heating the LED device with the hybrid material to a temperature of from 60 to 70° C. for 30 min to 4 h for degasing purposes. This process can be carried out under vacuum.

The curing is a result of the crosslinking of the Si-vinyl groups with Si—H. Nanoparticles modified with alkenyl groups can also take part in the curing process. This addition reaction is triggered by simple heating, by applying a high energy radiation, or by a radical reaction caused by a radical generating catalyst (e.g. peroxyde or azo-compound) activated by heat or radiation or by a metal catalyst (e.g. Pt- or Pd-compounds).

It is readily understood by those skilled in the art that in the curing step, in particular in an oxygen containing atmosphere, such as an ambient atmosphere, or especially during the lifetime of the LED, where the LED encapsulant is exposed to air at higher operating temperatures up to 120° C. in combination with intensive light radiation, a certain amount of the —SiR$^2$—NH moieties in the organopolysilazane material is converted to Si—O groups.

However, in the cured hybrid material, i.e. the encapsulation material of the invention the majority of the SiR$_2$—NH groups is maintained, typically >80%, preferably >85%, more preferred >90% (by FTIR). Typically only the surface of the encapsulant—which is in direct contact with oxygen of the atmosphere—is slightly oxidised. FT-IR spectra of the surface and the material 500 µm below the surface show only a small amount Si—O signals at the surface. The major signals of the Si—N, Si—H and N—H groups still remain unchanged, which proofs that only a minor oxidation takes place. The FT-IR of the material 500 µm below the surface shows almost unchanged polysilazane.

The hybrid material of the invention can be cured at high temperatures in a very short time, thus ensuring sufficient curing in the drying section. Since polysilazanes and nanoparticles show great temperature stability, a higher curing temperature is possible than in the case of conventional coating systems, such as e. g. epoxy resins. The only limits on this temperature are generally those imposed by the thermal deformability of the LED material.

Curing of the hybrid material of the invention in the encapsulation process takes place preferably at an [oven] temperature of 90° C. to 200° C., preferably 110° C. to 170° C., more preferably 120° C. to 160° C. The drying time is usually 2 to 10 hours, preferably 4 to 6 hours, depending on the thickness of the material.

The encapsulating material obtained by curing the organopolysilazane material of the invention is new.

The cured encapsulation material of the invention is obtainable by
a) providing the encapsulation material of the invention,
b) optionally crosslinking the encapsulation material of the invention by treatment with a base, and
c) curing the encapsulation material of the invention by heating it to a temperature of from 80° C. to 220° C. for a period of from 1 min to 6 h in an inert atmosphere or air.

The encapsulation material of the invention can be used as an insulating transparent filling material for light emitting diodes (LED). The encapsulant is highly transparent in UV and visible (typically 99% at 400 nm in 1 mm path). The material shows thermal stability that means the transmission is still at least 90% at 400 nm after exposure to 150° C. for 6 hours in nitrogen. The encapsulant shows resistance to UV radiation, i.e., the transmission is typically 98% after exposure to UV-A light (315-400 nm) for 6 hours. The encapsulant has a refraction index of 1.35 or higher, typically of from 1.40 to 2.50, preferably 1.45 to 2.00.

The encapsulation material for LEDs according to the invention can be used in a variety of LED devices such as high brightness light emitting diodes (HBLEDs), vertical cavity surface emitting lasers (VCSELs), laser diodes, flat panel displays, projection display optics components, injection-moldable optical lenses and other optical parts, devices and structures. It can be further used as part of photo semiconductor devices mounted with blue or white LED elements. LEDs comprising the encapsulation material of the invention can be used for backlights for liquid crystal displays, traffic lights, outdoor big displays, advertisement sign boards and the like.

In a further embodiment, the invention provides an LED comprising the encapsulation material of the invention.

A typical LED package according to the invention comprises an LED chip, and/or a lead frame and/or gold wire and/or solder (flip chip) and/or the filling material, converter, the encapsulation material of the invention and a primary and secondary optic. The encapsulation material has the function of a surface protection material against external environmental influences and guarantees long term reliability in particular aging stability.

For example, in accordance with the present invention a light emitting diode is constructed similarly to the ones described in U.S. Pat. Nos. 6,274,924 and 6,204,523. In a preferred embodiment, a light emitting diode (LED) component is provided comprising: an LED chip emitting light having a wavelength in a range of 200 to 570 nanometers; and a package including an optic encasing the LED chip, the optic comprising an encapsulation material of the invention being transmissive to light in a wavelength range from ultraviolet through green, wherein the organopolysilazane material of the invention maintains its transmissiveness when exposed to a temperature of 100° C.; and a light-emitting substance, embedded in the encapsulation material, the light-emitting substance emitting light responsive to excitation by light of a predetermined wavelength, wherein the light emitted by the light emitting substance has a peak wavelength greater than the peak wavelength of light emitted by the LED chip.

The invention is further illustrated by the following examples without limiting it thereto.

EXAMPLES

Synthesis Examples

The following example shows the synthesis of an organopolysilazane material of the invention by base catalyzed crosslinking of the organosilazanes ML-33 and HTT-1800 available from AZ Electronic Materials Germany GmbH, Wiesbaden, Germany.

Example A (Synthesis of Organopolysilazane)

A 250 ml flask was purged with dry nitrogen and charged with 16.7 g HTT-1800, 33.3 g ML-33 and 100 g 1.4-Dioxane. After cooling down to 0° C. 0.5 g of potassium-hexamethyldisilazane were added. After addition of the catalyst, gas formation could be observed. The mixture was stirred for 2 h at 0° C. and for additional 2 h at 20° C. Then 0.5 g chlorotrimethylsilane were added. The precipitate was removed by filtration and all of the solvent was removed by evaporation under reduced pressure.

Yield: 47 g of a colorless viscous oil.

Examples B-E (Synthesis of Dispersions of Inorganic Nanoparticles)

Example B (Synthesis of $ZrO_2$ Dispersions)

The zirconium dioxide dispersion in toluene with a mean particle size of <10 nm was made of watery $ZrO_2$ dispersions available from NYACOL. For this aim, the watery $ZrO_2$ dispersions were first diluted with methanol, then methyltrimethoxysilane was added, then they were stirred at 60° C. for 6 h and finally the solvent was replaced with toluene by distillation.

Example C (Synthesis of $TiO_2$ Dispersions)

The titanium dioxide dispersions in toluene with a mean particle size of ca. 10 nm and ca. 25 nm were made from isopropanolic $TiO_2$ dispersions available from Lotus-Synthesis or Sigma-Aldrich, respectively. For this aim, first methyltrimethoxysilane was added to the isopropanolic $TiO_2$ dispersions, then these were stirred at 60° C. for 6 h and subsequently the solvent was replaced with toluene by distillation.

Example D (Synthesis of $SiO_2$ Dispersions)

The silicon dioxide dispersions in toluene with a mean particle size of from 15 nm to 85 nm were made from aqueous $SiO_2$ dispersions (KLEBOSOL), available from AZ Electronic Materials. For this aim, first the aqueous $SiO_2$ dispersions were diluted with n-propanol, the methyl-trim-ethyloxysilane was added, then the dispersions were stirred at 60° C. for 6 h and subsequently the solvent was replaced with toluene by distillation.

Example E (Synthesis of ZrO2 Dispersion by Nonaqueous Process)

ZrO2 nanoparticles were synthesized according to the nonaqueous process described in "S. Zhou, G. Garnweitner, M. Niederberger and M. Antonietti, Langmuir, 2007, 23, pages 9178-9187" and "T. A. Cheema and G. Garnweitner published in Chemie-Ingenieur-Technik, 2008, 84/3, pages 301-308".

80 ml zirconium(IV)-n-propoxide and 500 ml benzyl alcohol were placed in an Teflon coated steel autoclave and heated to 220° C. for 4 days. After cooling down to room temperature, the solid ZrO2 material was separated from the supernatant liquid by centrifugation. The isolated material was washed 3 times with 1 L of ethanol. 5 g of the wet solid material was then suspended in 200 ml of THF and 1.7 g n-propyl(trimethoxy)silane were added. The mixture was sonicated for 10 min and stirred at room temperature for 3 days. The transparent dispersion was then concentrated by evaporation of a part of the THF to adjust a solid content of 20 weight %. The average particle size was characterized by light scattering and was found to be 7 nm.

Examples 1-9 (Synthesis of Hybrid Material)

All nanoparticle dispersions from Examples B-E were adjusted to a solids content of 20 weight percent.

Example 1

In a 250 ml flask 50 g of polysilazane was dissolved in 50 g of THF in a nitrogen atmosphere and under careful exclusion of water. While stirring, 175 g of a zirconium dioxide dispersion in toluene with a mean particle size of approx. <10 nm and a solids content of 20 weight percent were dropped in. The THF and the majority of the toluene were distilled off at the rotary evaporator at 50° C. bath temperature and a reduced pressure of approx. 15 mbar. The last remaining toluene was removed from the residue in a high vacuum of <0.1 mbar at 40° C. for less than 24 h.

83 g of a colorless transparent oil remained.

Example 2

Example 2 was carried out analogously to example 1, the only difference being that the amount of zirconium oxide dispersion in toluene was increased to 250 g.

The final product was 97 g of a colorless transparent oil.

Example 3

Example 3 was carried out analogously to example 1, the only difference being that the amount of zirconium oxide dispersion in toluene was increased to 750 g.

194 g of a colorless transparent oil remained as the final product.

Example 4

Example 4 was carried out analogously to example 1, the only difference being that the zirconium oxide dispersion was replaced by 250 g of a titanium dioxide dispersion in toluene with a mean particle size of approx. 10 nm and a solids content of 20 weight percent.

96 g of a colorless nearly transparent oil remained as the final product.

Example 5

Example 5 was carried out analogously to example 4, the only difference being that the titanium dioxide dispersion in toluene was coated with Vinyltrimethoxysilane instead of methyltrimethoxysilane.

95 g of a colorless nearly transparent oil remained as the final product.

Example 6

Example 6 was carried out analogously to example 1, the only difference being that the zirconium dioxide dispersion was replaced by 250 g of a titanium dioxide dispersion in toluene with a mean particle size of approx. 25 nm and a solids content of 20 weight percent.

95 g of a colorless opalescent oil remained as the final product.

Example 7

Example 7 was carried out analogously to example 1, the only difference being that the zirconium dioxide dispersion was replaced by 250 g of a silicon dioxide dispersion in toluene with a mean particle size of approx. 15 nm and a solids content of 20 weight percent.

94 g of a colorless nearly transparent oil remained as the final product.

Example 8

Example 8 was carried out analogously to example 1, the only difference being that the zirconium dioxide dispersion was replaced by 250 g of a silicon dioxide dispersion in toluene with a mean particle size of approx. 85 nm and a solids content of 20 weight percent.

96 g of a colorless slightly cloudy oil remained as the final product.

Example 9

Example 9 was carried out analogously to example 1, the only difference being that 250 g of the zirconium dioxide dispersion of Example E in THF with a mean particle size of approximately 7 nm and a solids content of 20 weight percent was used.

94 g of a colorless transparent oil remained as the final product.

Reference Example 10

The polysilazane "as it is" was used as a reference example 9 for a polysilazane without addition of any nanoparticles.

The examples are shown in comparison in Table 1.

The viscosity of the oil-like products is determined with a R/S Plus Rheometer by the company Brookfield. The transmission of the liquid samples was measured with a UV-VIS spectrophotometer Lambda 850 from Perkin Elmer before curing. The products were cured in order to determine the refractive index. For this aim, the oil-like products were each mixed with 0.5 wt.-% di-t.butyl-peroxide, poured into a 3 cm×2 cm PTFE receptacle to a height of 3 mm and cured for 3 h at 180° C. in a nitrogen atmosphere. Subsequently, the hardened molded piece was removed from the PTFE receptacle and the refractive index was measured with a Prism Coupler Model 2010/M by the company Metricon working at 594 nm.

TABLE 1

Listing of the Examples

| Example | Raw material 1 | Raw material 2 | Ratio 1:2 [m:m] | Viscosity [mPas at 25° C.] | RI* [594 nm] | Transmittance** |
|---|---|---|---|---|---|---|
| 1. | Polysilazane | ZrO$_2$, <10 nm | 1.0:0.7 | 39000 | 1.57 | 99% |
| 2. | Polysilazane | ZrO$_2$, <10 nm | 1.0:1.0 | 44000 | 1.61 | 99% |
| 3. | Polysilazane | ZrO$_2$, <10 nm | 1.0:3.0 | 55000 | 1.74 | 98% |
| 4. | Polysilazane | TiO$_2$, 10 nm | 1.0:1.0 | 43000 | 1.65 | 91% |
| 5. | Polysilazane | TiO$_2$, 10 nm | 1.0:1.0 | 43000 | 1.65 | 90% |
| 6. | Polysilazane | TiO$_2$, 25 nm | 1.0:1.0 | 38500 | 1.66 | <50% |
| 7. | Polysilazane | SiO$_2$, 15 nm | 1.0:1.0 | 43500 | 1.49 | 68% |
| 8. | Polysilazane | SiO$_2$, 85 nm | 1.0:1.0 | 37500 | 1.49 | <50% |
| 9. | Polysilazane | ZrO$_2$, <10 nm | 1.0:1.0 | 48000 | 1.60 | 99% |
| 10. Reference | Polysilazane | — | — | 37000 | 1.50 | 100%*** |
| 11. Reference **** | HRI-Silicone | | | | 1.55 | 100% |
| 12. Reference **** | LRI-Silicone | | | | 1.41 | 100% |

*Refractive Index of the cured sample
**Transmittance of the liquid sample at 450 nm and thickness of 3 mm relative to example 9
Since the organopolysilazane and the nanoparticles do not absorb light of 450 nm wavelength, the reduced transmittance is ascribed to scattering
***Transmittance of the Reference Example was normalized to be 100% at all wavelength
**** HRI-Silicone and LRI-Silicone are available from Dow Corning The comparison of Reference Example 10 with Example 1, Example 2 and Example 3 shows that increasing the proportion of highly refractive zirconium dioxide increases the refractive index. Due to the nanoparticles, a slight increase of viscosity can be observed. As the nanoparticles are smaller than 10 nm, no or a very small degree of scattering of light occurs and the optical transparency is just as high or only slightly lower than in Reference Example 10.

Examples 4, 5 and 6 show that the refractive index can also be increased by admixing highly refractive titanium dioxide. With nanoparticles of small size, such as in Examples 4 and 5, the optical transparency is retained to ≥90%, whereas use of larger nanoparticles, such as in example 6, can cause opalescence.

Comparison of Example 4 and 5 proofs that the surface of the nanoparticles can be coated either with non-reactive alkyl groups or with vinyl groups which are able to participate in the crosslinking reaction of the organopolysilazane during the curing process. This will not change the transparency of the product.

Examples 7 and 8 show that the refractive index of the mixture is slightly lowered by admixing a silicon dioxide with a refractive index smaller (n amorphous $SiO_2$=1.46) than that of the polysilazane. With nanoparticles of 15 nm size, such as in Example 7, the optical transparency is noticeable lowered, whereas use of larger nanoparticles with a radius of about 85 nm, such as in Example 8, causes a marked opalescence.

Reference Examples 11) and 12) show commercially available silicone encapsulation materials. Standard methylsilicones (Example 12) are known to have good thermal stability, however their big drawback is the low RI of <1.45. Commercially available high RI silicones (example 11) have RI up to 1.55, but can not reach RI numbers beyond 1.6.

Thus, it can be shown that by mixing polysilazane with nanoparticles whose refractive index is higher or lower than that of pure polysilazane, the refractive index of the mixture can be increased or lowered. The refractive index can theoretically be adjusted between 1.3 to 2.4. The mixtures containing nanoparticles can be cured in the same way as pure polysilzane. If the nanoparticles are sufficiently small, no light dispersion occurs and the optical transparency is maintained completely (see FIG. 1).

Example for Lower CTE Sample

Another advantage of the presence of nanoparticles is the reduction in thermal expansion of the hybrid material compared to the pure polysilazane. The CTE (Coefficient of Thermal Expansion, analyzed with a Mettler-Toledo TMA/SDTA840 in a temperature range of 50-150° C.) of cured polysilazane is in a range of 150-250 ppm/K. The CTE of cured polysilazane filled with 50% weight % of nanoparticles is in a range of 125-200 ppm/K. The advantage of reduced CTE is less stress in the material by temperature change and therefore a lower tendency of crack formation.

Example for Hydrolysis Stability

An additional advantage of nanoparticles filled organopolysilazane compared to the pure polysilazane is that the refractive index does not change if the cured material is exposed to higher temperature and humidity conditions. The cured materials of Example 3 and of Example 10 were stored in a climate chamber at 80° C. and 85% relative humidity for 82 h. The refractive index of reference material of Example 10 was reduced from 1.50 to 1.48 by partial hydrolysis of the silazane to siloxane. The refractive index of the material of Example 3 remains unchanged at 1.74. The presence of the nanoparticle prevents the change in refractive index under conditions which are able to at least partly hydrolyze the polysilazane.

FIG. 1 shows transmission curves of various examples:

Transmittance of reference Example 10 was normalized to be 100% at all wavelength. Therefore the spectra shown in FIG. 1 show reduction of transmittance caused by addition of Nanoparticles
- - - - - A) transmittance of material of Example 1
———— B) transmittance of material of Example 3
·········· C) transmittance of material of Example 4
—·—·—·· D) transmittance of material of Example 7

Since the organopolysilazane and the nanoparticles do not absorb light of >350 nm wavelength, the reduced transmittance is ascribed to scattering phenomena. The transmittance of reference Example 10 was normalized to be 100% at all wavelength. Therefore the reduction in transmittance shown in FIG. 1 is a result of light scattering caused by the presence of the nanoparticles. The scattering intensity depends of course not only on the particle size, but also on the difference in refractive index of the particles and the surrounding matrix, as can be calculated by the well known equation:

$$I \sim M \cdot (dn/dc)^2 \cdot \lambda^4$$

I=Intensity of scattered light
M=Molecular weight. For a homogeneous sphere M~radius³
dn/dc~difference in refractive index of the particles and the surrounding matrix If the refractive index of the particles and the surrounding matrix is the same, there will be no light scattering, regardless of the size of the particles. Avoiding scattering by this approach is not useful to make high RI material, because in such a situation the refractive index of the hybrid material is not different from the refractive index of the pure matrix.

Figure 2:
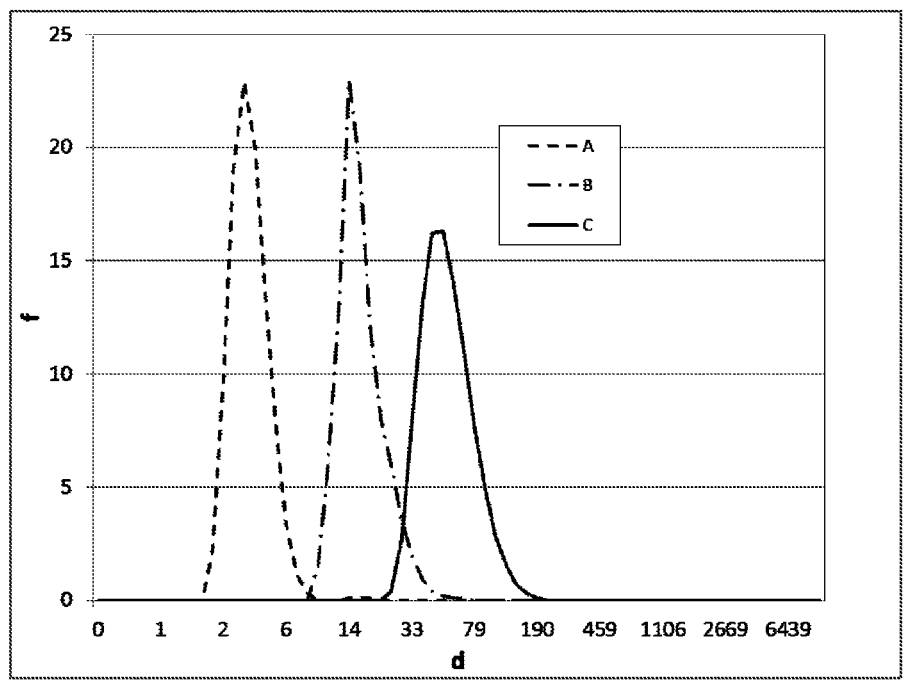

FIG. 2 shows the particle size distribution of various examples:
- - - - - A) particle size of Nanoparticles used in Example 1, 2 and 3
—·—·—·· B) particle size of Nanoparticles used in Example 7
———— C) particle size of Nanoparticles used in Example 8

Distribution A) is an example of a exceptionally preferred particle distribution used to make transparent hybride material, which in the definition used here has a transmission of ≥80% at 450 nm. Distribution B) is an example of acceptable particle distribution and distribution C is an example of non preferred particle distribution. B) and C) will form partly transparent and/or opaque hybrid material, which in the definition used here has a transmission of <80% at 450 nm.

Figure 3:
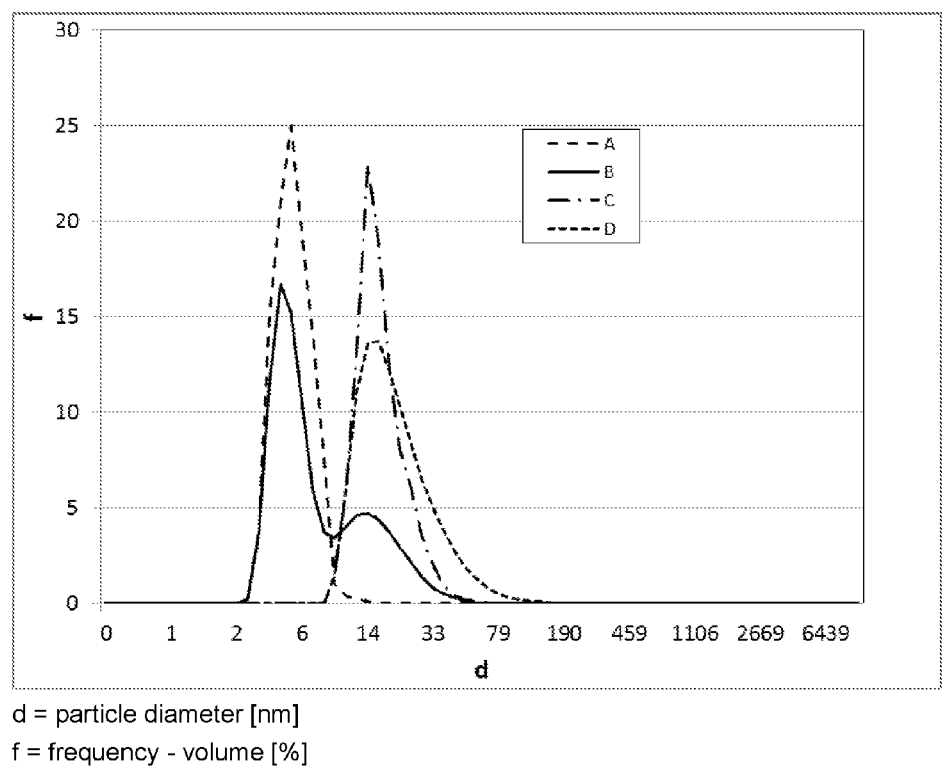

FIG. 3 shows further particle sizes and distributions:
- - - - - A) preferred particle size and distribution: small average <10 nm and narrow distribution
———— B) Less preferred particle size and distribution: small average <10 nm but bimodal distribution containing a big amount of particles >10 nm
—·—·—·· C) Less preferred particle size and distribution: big average >10 nm and narrow distribution
·········· D) None preferred particle size and distribution: big average >10 nm and broad distribution containing particles up to 100 nm size.

FIG. 3 shows examples of small and narrow distributions (A), small but bimodal distributions (B)), a medium size and narrow distribution (C) and a medium size but broad distributions (D). Only distributions obeying the two conditions of small average size of <15 nm and narrow distribution with small amount of average size particles and absence of big size particles as shown in distribution A) are useful to make fully transparent hybrid material.

If—for any reason—a certain turbidity is irrelevant or is even intended, bigger particles with broader distribution can be used as well. In case the turbidity should be adjusted to a certain level at constant refractive index, this can be done by keeping the mixing ratio of nanoparticles and matrix constant (which defines the refractive index) and changing the size (average and distribution) of the nanoparticles.

Figure 4:
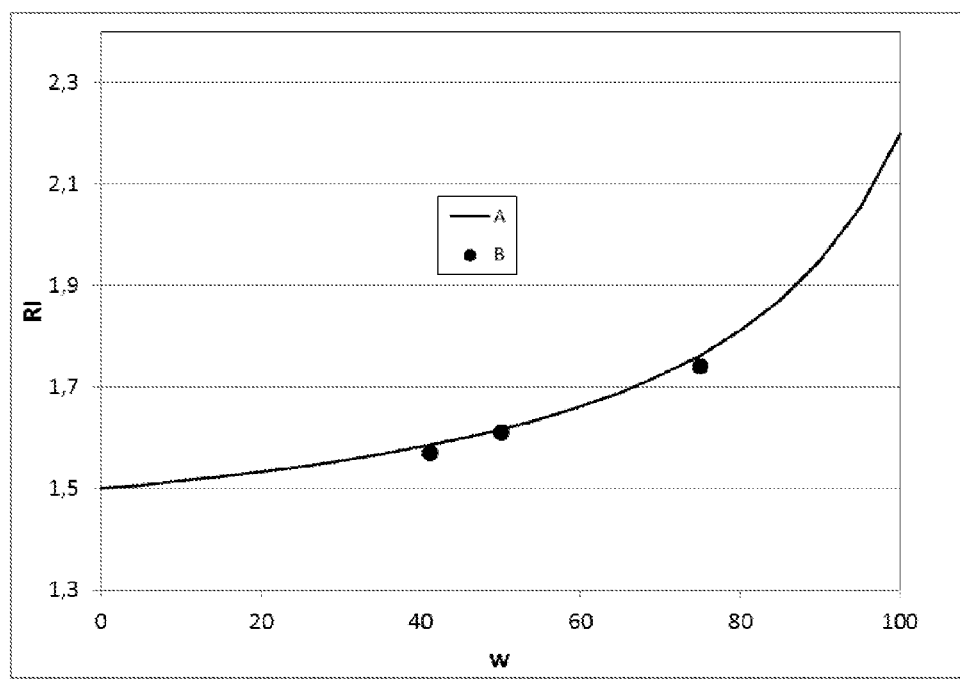
Figure 4:

FIG. 4 shows the comparison of the RI numbers of the Examples 1, 2 and 3 and a theoretical calculation of RI of a mixture of polymer and $ZrO_2$.

—— A) Theoretical calculation
● B) experimental numbers of Example 1, 2 and 3

The calculation is based on the assumption that the polymer has a RI of 1.5 and a density of 1.0 g/ml and the $ZrO_2$ has a RI of 2.2 and a density of 5.0 g/ml. It can be seen that the experimental results nicely follow the theoretical expectations.

To test the thermal stability, some selected solid cured samples of 30×20×3 mm size were prepared and stored on an open hotplate (exposed to air atmosphere) at a temperature of 120° C., 180° C. and 200° C. for 24 h. After the heat treatment the transmittance was measured using a Perkin Elmer UV-VIS Spectrophotometer Lambda 850 in combination with an integration sphere.

| Material | Temperature/Time | Transmittance at 450 nm* |
|---|---|---|
| Example 2 | 120° C./24 h | 99% |
| Example 2 | 180° C./24 h | 97% |
| Example 2 | 200° C./24 h | 97% |
| Ref. 10 | 200° C./24 h | 98% |
| Ref. 11, HRI Silicone | 120° C./24 h | 87% |

*Transmittance of solid sample at 450 nm and thickness of 3 mm

Figure 5:
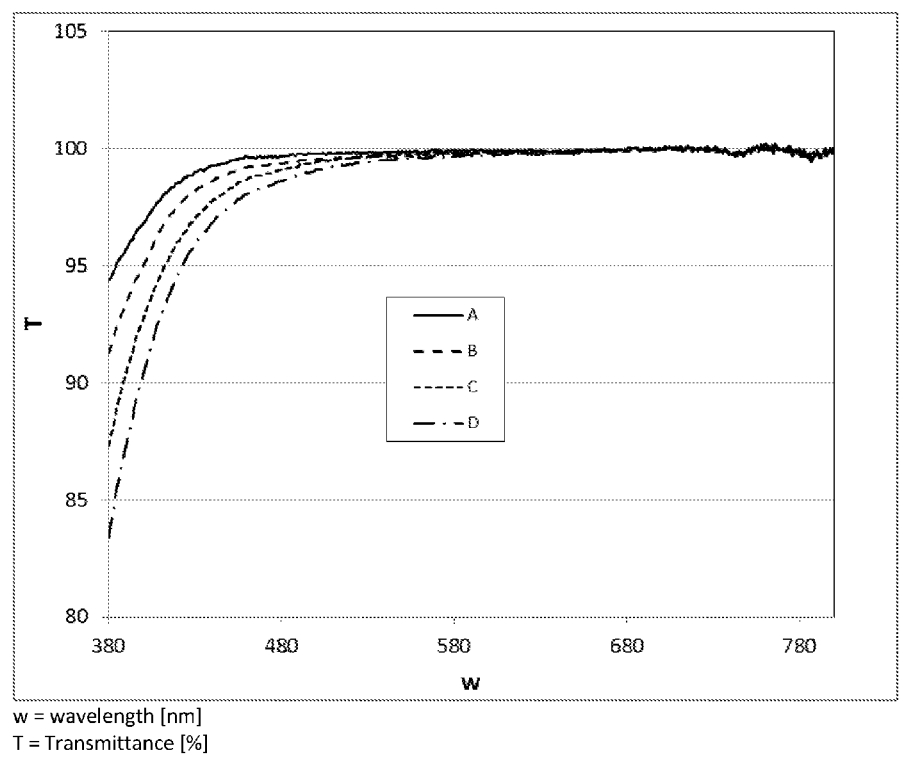

FIG. 5 shows transmission curves after stability test at elevated temperatures:
—— A) transmittance of cured material of Example 2 after 24 h at 120
----- B) transmittance of cured material of Example 2 after 24 h at 180° C.
·········· C) transmittance of cured material of reference Example 9 after 24 h at 200° C.
—·—·— D) transmittance of cured material of Example 2 after 24 h at 200° C.

There is a slight decrease in transmittance by heating up to 200° C., but only to a minor and tolerable extent. Comparison of Sample 2 and the Ref. Example 9 proves that there is virtually no deterioration of the transmittance by the presence of the nanoparticles up to 200° C.

Figure 6:
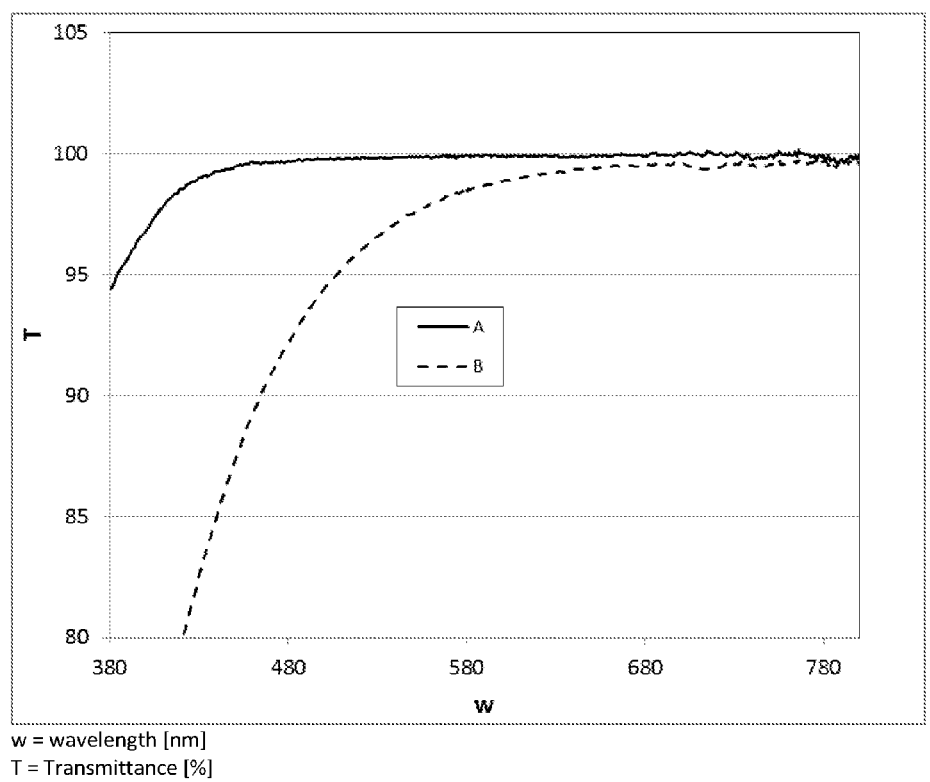

FIG. 6: Transmission curves after stability test at elevated temperatures
—— A) transmittance of cured material of Example 2 after 24 h at 120
----- B) transmittance of cured material of Reference Example 10 (HRI Silicone) after 24 h at 120° C.

FIG. 6) shows the transmittance of Example 2 and Reference Example 10) after heating to 120° C. for 24 h. The commercially available HRI silicones are made of arylsilicones, for example phenyl-silicones. The aromatic residue increases the RI, however the thermal stability is dramatically reduced. Already at temperatures as low as 120° C., the transmittance drops from the initial value of 100% down to unacceptable 87% at 450 nm.

The invention claimed is:
1. A hybrid material for light emitting diodes, comprising
a) an organopolysilazane material, comprising repeating units of formulae (I) and (II)

wherein the symbols and indices have the following meanings:
$R^1$ is $C_2$-$C_6$-alkenyl or $C_4$-$C_6$-alkadienyl;
$R^2$ is H or an organic group;
$R^3$ is H or an organic group;
$R^4$ is H or an organic group;
$R^5$ is H or an organic group;
x is 0.001 to 0.2; and
y is 2x to (1−x),
with the proviso that x+y≤1 and that y can be 0 if $R^2$ is H, and
(b) inorganic nanoparticles having a mean diameter in the range of from 1 to 30 nm, which are surface modified with a capping agent comprising a $C_1$-$C_{18}$-alkyl and/or $C_1$-$C_{18}$-alkenyl group.
2. The material according to claim 1, wherein
$R^1$ is ($C_2$-$C_6$)-alkenyl or ($C_4$-$C_6$)-alkadienyl;
$R^2$ is ($C_1$-$C_8$)-alkyl, ($C_2$-$C_6$)-alkenyl, ($C_3$-$C_6$)-cycloalkyl, ($C_6$-$C_{10}$)-aryl or H;
$R^3$ is H or ($C_1$-$C_8$)-alkyl, ($C_2$-$C_6$)-alkenyl, ($C_3$-$C_6$)-cycloalkyl or ($C_6$-$C_{10}$)-aryl;
$R^4$ is H or ($C_1$-$C_8$)-alkyl, ($C_2$-$C_6$)-alkenyl, ($C_3$-$C_6$)-cycloalkyl or ($C_6$-$C_{10}$)-aryl;
$R^5$ is H or ($C_1$-$C_8$)-alkyl, ($C_2$-$C_6$)-alkenyl, ($C_3$-$C_6$)-cycloalkyl or ($C_8$-$C_{10}$)-aryl;
x is 0.02 to 0.1 and
y is preferably 2*x to 0.98.
3. The material according to claim 1 wherein
$R^1$ is vinyl or allyl;
$R^2$ is ($C_1$-$C_4$)-alkyl, phenyl or H;
$R^3$ is H;
$R^4$ is ($C_1$-$C_4$)-alkyl, phenyl or H;
$R^5$ is H;
x is 0.03 to 0.075 and
y is 2*x to 0.97.
4. The material according to claim 1, wherein
$R^1$ is vinyl;
$R^2$ is methyl, ethyl, propyl or phenyl;
$R^3$ is H and
$R^4$ is methyl, ethyl, propyl or phenyl;
$R^5$ is H;
x is 0.03 to 0.06 and
y is 2*x to 0.97.
5. The material according to claim 1, wherein the organopolysilazane comprises one or more organopolysilazane comprising a repeating unit of formula (I) and/or formula (II) and one or more repeating units of formula (III) and/or (IV),

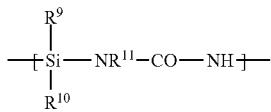

wherein $R^6$, $R^7$, and $R^9$ are independently an organic group;

$R^{10}$ is H or an organic group, and $R^8$ and $R^{11}$ are independently H or an organic group.

6. The material according to claim 5, wherein the symbols in formulae (III) and (IV) have the following meanings:
   $R^6$, $R^7$ and $R^9$ are independently $(C_1\text{-}C_8)$-alkyl, $(C_3\text{-}C_6)$-cycloalkyl or $(C_6\text{-}C_{10})$-aryl;
   $R^{10}$ is independently $(C_1\text{-}C_8)$-alkyl, $(C_3\text{-}C_6)$-cycloalkyl or $(C_6\text{-}C_{10})$-aryl, $(C_2\text{-}C_6)$-alkenyl, $(C_4\text{-}C_6)$-alkadienyl or H and
   $R^8$ and $R^{11}$ are H, $(C_1\text{-}C_8)$-alkyl, $(C_3\text{-}C_6)$-cycloalkyl or $(C_8\text{-}C_{10})$-aryl.

7. The material according to claim 1, wherein the molecular weight $M_w$ of the organopolysilazanes is in the range of 2000-150.000.

8. The material of claim 1, wherein the organopolysilazane material has a viscosity of 100-100.000 mPas at 25° C.

9. The material according to claim 1, wherein the amount of low molecular material with $M_w<500$ g/mol in the organopolysilazane material is below 15 wt.-%.

10. The material according to claim 1, wherein the inorganic nanoparticles have an average mean diameter in the range of from 3 to 20 nm.

11. The material according to claim 1, wherein the inorganic nanoparticles are selected from the group consisting of semiconductor nanoparticles, metal nanoparticles, metal oxide nanoparticles and a combination comprising at least one of the foregoing.

12. The material according to claim 11, wherein the inorganic nanoparticles are selected from the group consisting of $ZrO_2$, $BaTiO_3$ and $TiO_2$.

13. The material according to claim 1, wherein the inorganic nanoparticles are surface modified with a alkoxysilane or chlorosilane capping agent.

14. The material according to claim 13, wherein the capping agent is selected from methyltrimethoxysilane, trimethylmethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxy-silane, methoxy(triethyleneoxy)propyltrimethoxysilane, 3-aminopropyltrimethoxysilane, 3-mercaptopropyltrimethoxysilane, vinyltrimethoxysilane, allyltrimethoxysilane, 3-isocyanatopropyltriethoxysilane, 3-isocyanatopropyl-trimethoxysilane and glycidoxypropyltrimethoxysilane.

15. The material according to claim 13, wherein the capping agent is selected from alkoxysilanes of formula (V)

$$R''_n Si(OR''')_m \qquad (V)$$

wherein n is 1, 2 or 3 and m is 4-n;

R'' is methyl, ethyl, linear, branched or cyclic alkyl with 3-8 carbon atoms, phenyl, $(C_2\text{-}C_6)$-alkenyl; and R''' is methyl, ethyl, n- or iso-propyl, n- or isobutyl.

16. The material according to claim 1, wherein the amount of inorganic nanoparticles is in the range of from 1 to 85% by weight, based on the whole material.

17. The material according to claim 1, wherein the refractive index of the material is in the range of from 1.35 to 2.50.

18. A process for producing an LED, comprising the steps of
   I) encapsulating the light emitting material of the LED with a hybrid material according to claim 1, by dispensing the material and
   II) curing the organopolysilazane of the invention optionally adding curing catalyst for 1 min to 6 h at a temperature of from 80° C. to 220° C. in an inert atmosphere or air.

19. The process of claim 18, comprising the steps
   Ia) providing a material according to claim 1 by mixing the organopolysilazane in solution with a nanoparticle dispersion, removing the solvent and
   Ib) applying the material to the LED as an encapsulation material.

20. An encapsulation material for LEDs, obtainable by
   a) providing a material according to claim 1,
   b) optionally subjecting the material to crosslinking by treatment with a base, and
   c) curing the material optionally adding curing catalyst by treating the material to a temperature in the range of from 80 to 220° C. for a period of from 1 min to 6 h in an inert atmosphere or air.

21. An LED, comprising the material according to claim 1 as an encapsulation material.

* * * * *